US010497562B1

(12) United States Patent
Park et al.

(10) Patent No.: US 10,497,562 B1
(45) Date of Patent: Dec. 3, 2019

(54) METHOD FOR MANUFACTURING GALLIUM NITRIDE SUBSTRATE USING THE HYDRIDE VAPOR PHASE EPITAXY

(71) Applicant: Industry-University Cooperation Foundation Hanyang University, Seongdong-gu, Seoul (KR)

(72) Inventors: Jea Gun Park, Seongnam-si (KR); Jae Hyoung Shim, Seoul (KR); Tae Hun Shim, Suwon-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/991,481

(22) Filed: May 29, 2018

(51) Int. Cl.
*H01L 21/02* (2006.01)

(52) U.S. Cl.
CPC ...... *H01L 21/0254* (2013.01); *H01L 21/0242* (2013.01); *H01L 21/0251* (2013.01); *H01L 21/0262* (2013.01); *H01L 21/02389* (2013.01); *H01L 21/02458* (2013.01); *H01L 21/02502* (2013.01); *H01L 21/02639* (2013.01); *H01L 21/02658* (2013.01)

(58) Field of Classification Search
CPC ......... H01L 21/02046; H01L 21/02389; H01L 21/0242; H01L 21/02458; H01L 21/02502; H01L 21/0251; H01L 21/0254; H01L 21/0262; H01L 21/02658
See application file for complete search history.

(56) References Cited

U.S. PATENT DOCUMENTS

| 6,528,394 | B1 | 3/2003 | Lee | |
|---|---|---|---|---|
| 8,383,494 | B2 * | 2/2013 | Han | C30B 29/406 117/84 |
| 2005/0103257 | A1 | 5/2005 | Xu et al. | |
| 2005/0167683 | A1 * | 8/2005 | Lee | C30B 25/02 257/81 |
| 2007/0138505 | A1 * | 6/2007 | Preble | C30B 25/02 257/190 |

(Continued)

FOREIGN PATENT DOCUMENTS

| JP | 2004-296640 A | 10/2004 |
|---|---|---|
| KR | 10-0893360 B1 | 4/2009 |
| WO | 2008/048303 A2 | 4/2008 |

OTHER PUBLICATIONS

Hae-Yong Lee et al., "The Control of mechanical bow for GaN substrate grown by HVPE with relatively longer radius of lattice curvative"; Physica status solidi; Mar. 27, 2014; pp. 477-482; No. 3-4; Seoul, Korea.

(Continued)

*Primary Examiner* — Stephen W Smoot
(74) *Attorney, Agent, or Firm* — Sughrue Mion, PLLC

(57) ABSTRACT

Disclosed a method of fabricating a gallium nitride substrate using hydride vapor phase epitaxy (HVPE), including a step of injecting ammonia ($NH_3$) gas to perform first surface treatment on a sapphire substrate; a step of injecting ammonia gas and hydrogen chloride (HCl) gas to form a buffer layer on the sapphire substrate; a step of injecting ammonia gas to perform second surface treatment on the sapphire substrate; and a step of allowing gallium nitride (GaN) to grow on the sapphire substrate while lowering the flow rate ratio of ammonia gas to hydrogen chloride gas stepwise.

7 Claims, 7 Drawing Sheets

(56) References Cited

U.S. PATENT DOCUMENTS

2012/0295428 A1* 11/2012 Melnik .............. H01L 21/0242
                                                        438/504
2013/0337639 A1* 12/2013 Ivantsov ............. H01L 21/0237
                                                        438/479

OTHER PUBLICATIONS

P. Visconti et al.; "Dislocation density in GaN determined by photoelectrochemical and hot-wet etching"; Applied Physics Letter; Nov. 27, 2000; pp. 1-6; vol. 77, No. 22; Seoul, Korea.

Office Action issued by German Patent Office dated Jan. 14, 2019 for the corresponding German Patent Application No. 10 2018 213 437.5.

\* cited by examiner

[FIG. 1A]
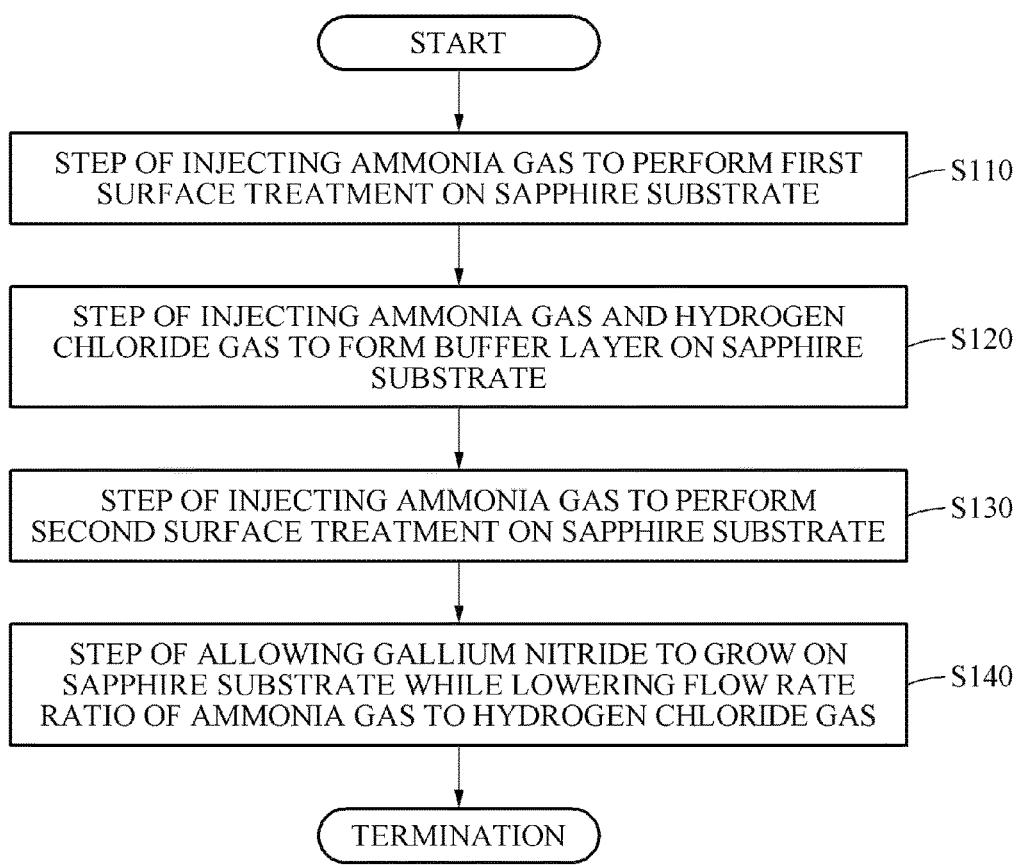

[FIG. 1B]
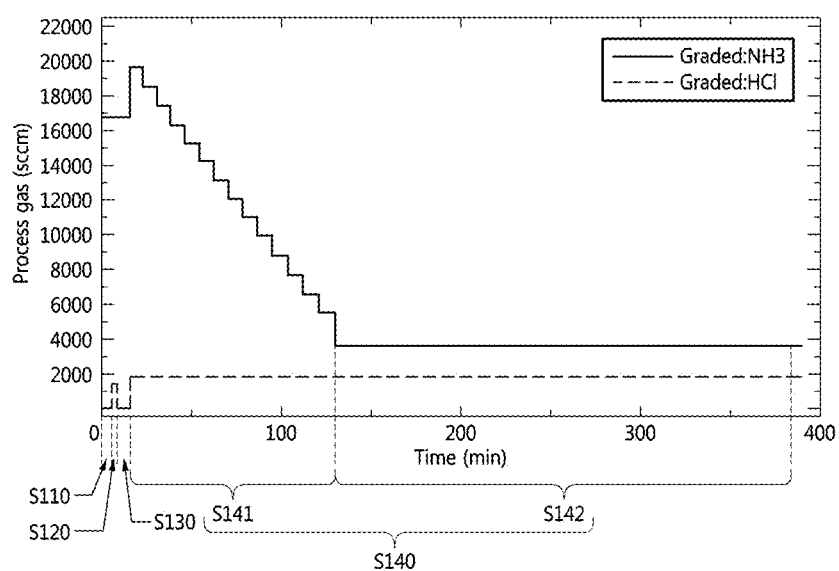
[FIG. 1C]
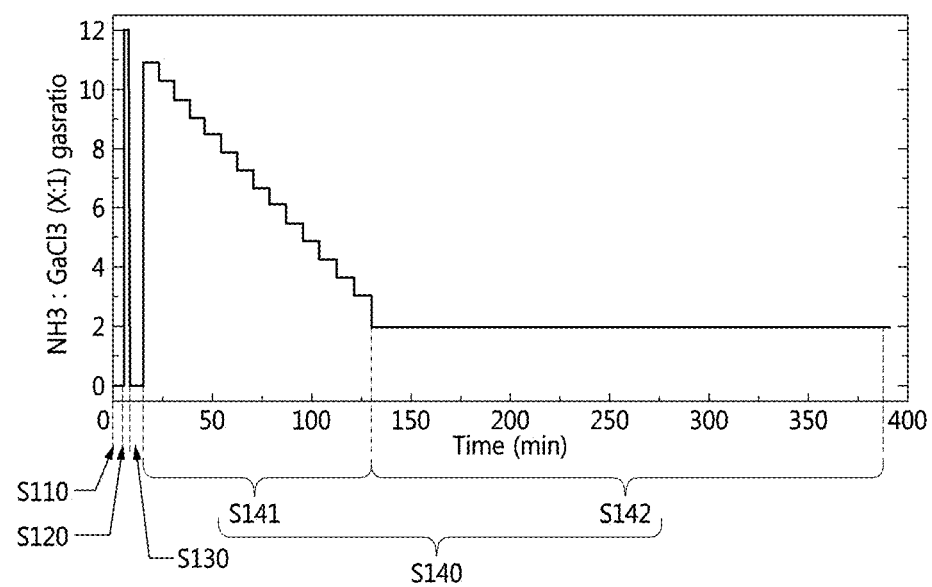

[FIG. 2]
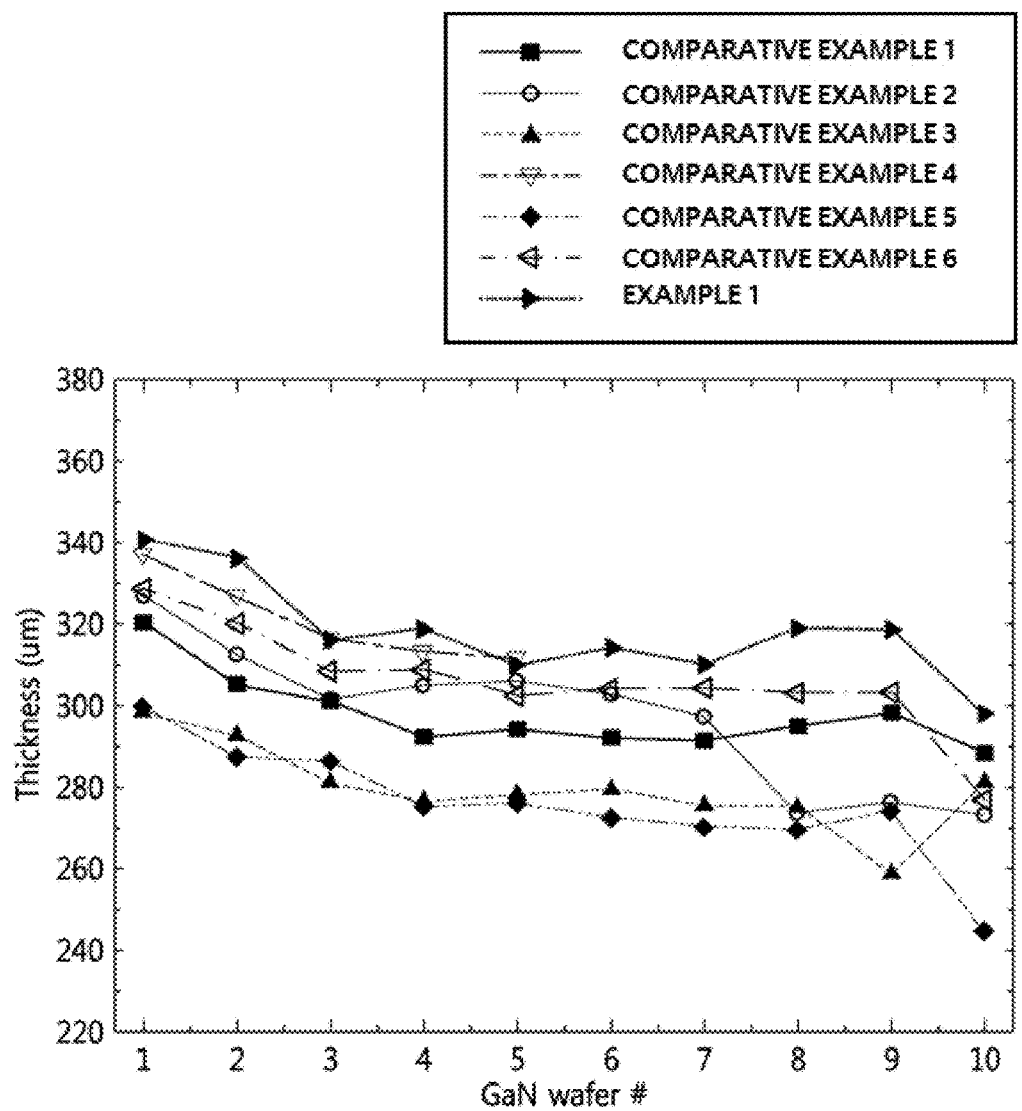

[FIG. 3]
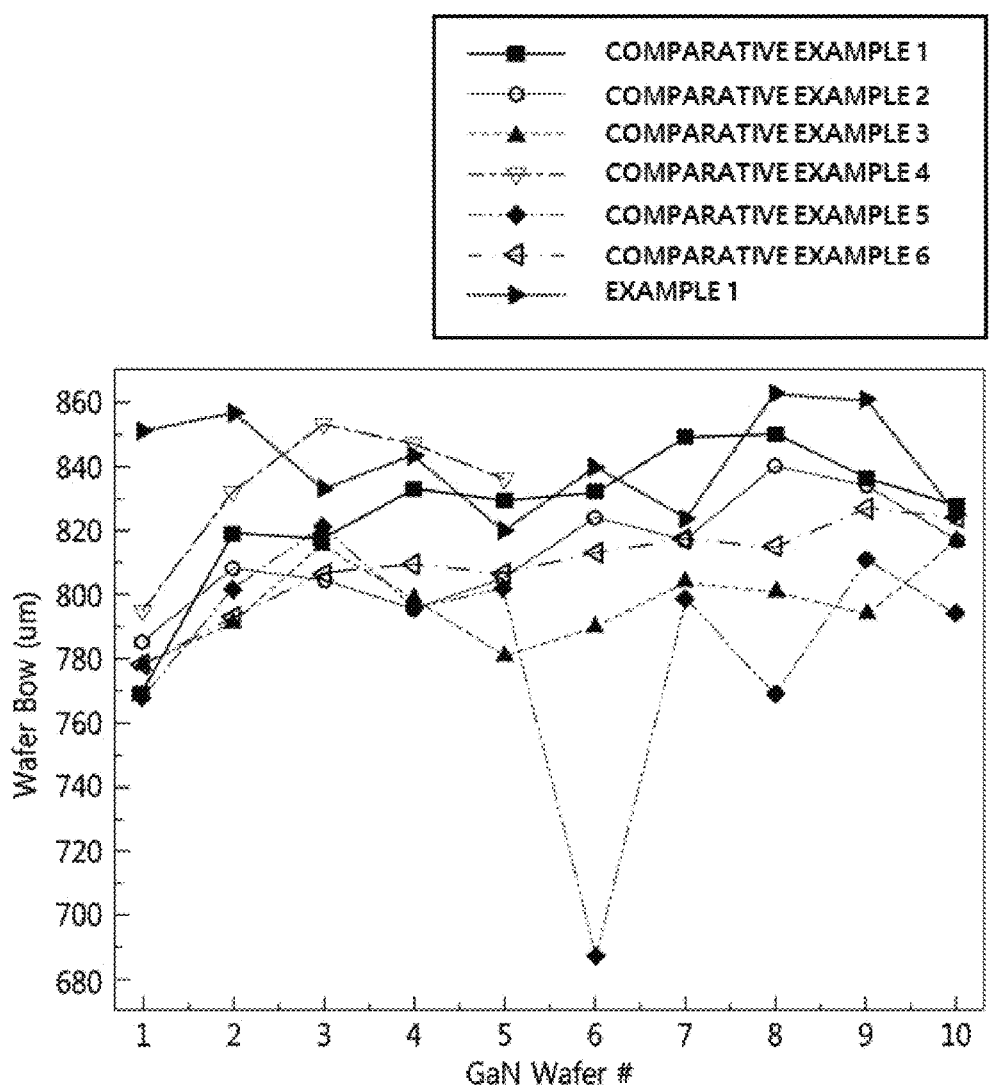

[FIG. 4]
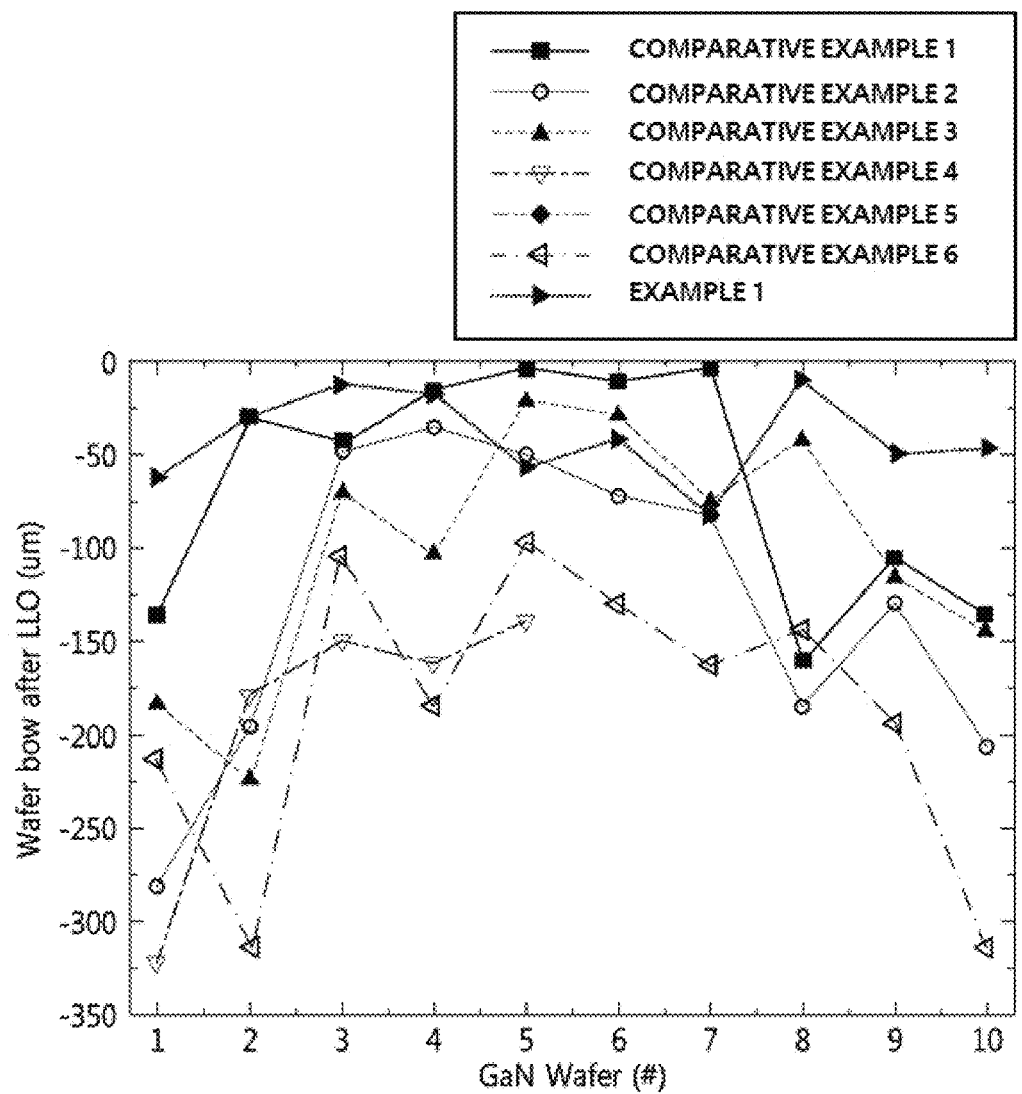

[FIG. 5A]
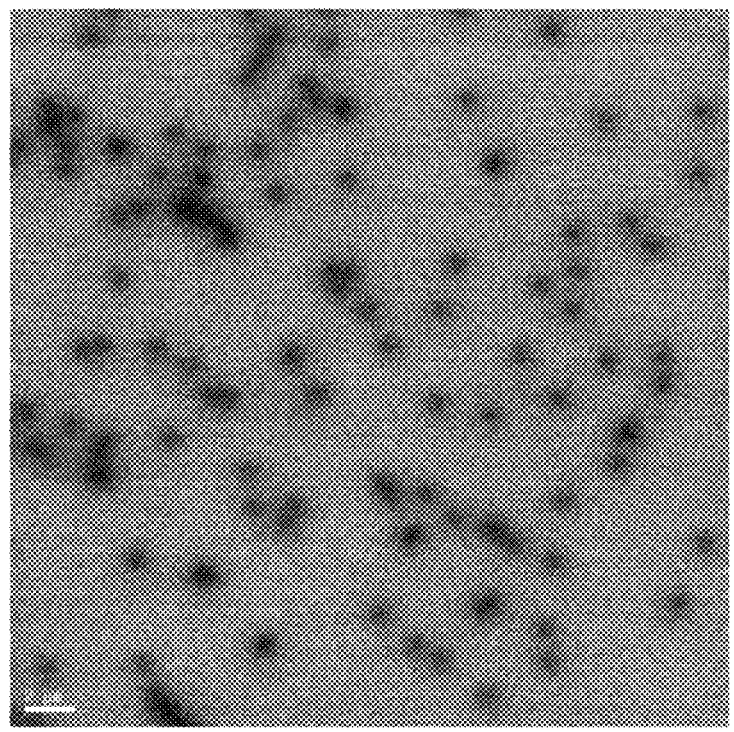
[FIG. 5B]
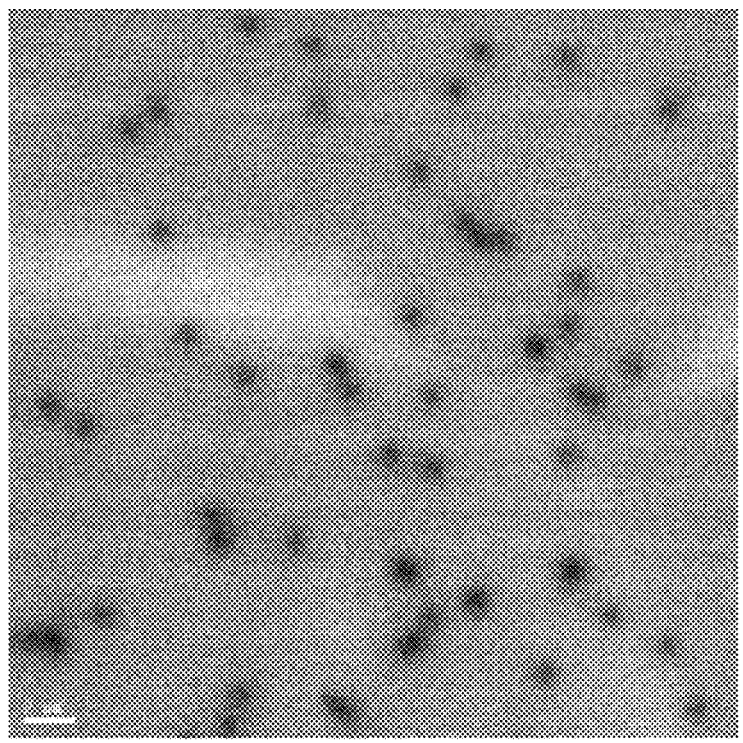

[FIG. 5C]
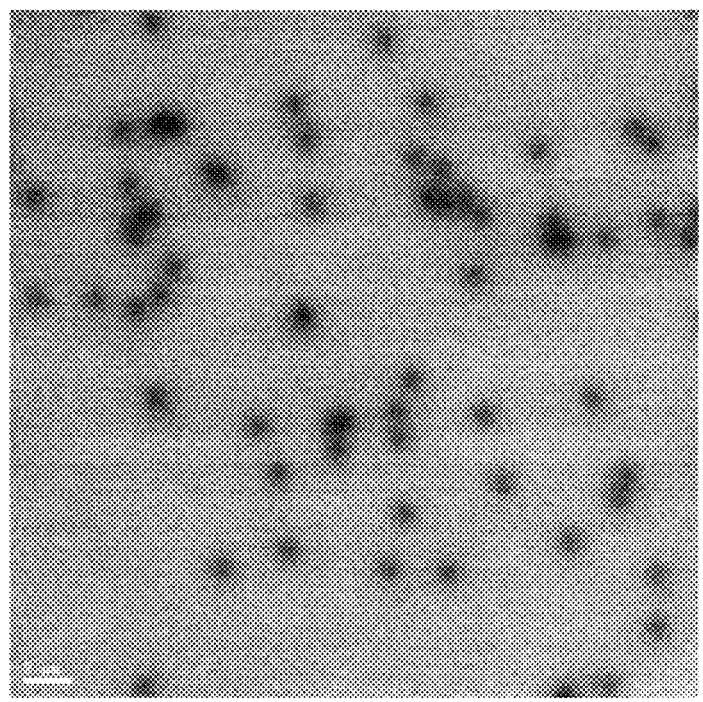

METHOD FOR MANUFACTURING GALLIUM NITRIDE SUBSTRATE USING THE HYDRIDE VAPOR PHASE EPITAXY

BACKGROUND OF THE DISCLOSURE

Field of the Disclosure

The present disclosure relates to a method of fabricating a gallium nitride substrate using hydride vapor phase epitaxy (HVPE), and more particularly, to a method of fabricating a gallium nitride substrate having high quality and a low defect density by preventing bowing and cracking of the gallium nitride substrate.

Description of the Related Art

The performance and lifespan of semiconductor devices, such as laser diodes and light emitting diodes, are determined by various factors constituting the device, and are particularly affected by a base substrate on which elements are stacked. Several methods of fabricating a high quality semiconductor substrate have been proposed.

A gallium nitride (GaN) substrate is a typical group III-V compound semiconductor substrate. In addition to a GaAs substrate and an InP substrate, the GaN substrate is suitably used for a semiconductor device. However, the fabrication costs of the GaN substrate are much higher than those of the GaAs substrate or the InP substrate.

In fabricating a gallium nitride (GaN) semiconductor, a single crystal GaN film is formed on a heterogeneous substrate using vapor growth methods, such as metal organic chemical vapor deposition (MOCVD), molecular beam epitaxy, and hydride vapor phase epitaxy (HVPE).

Thereamong, the HVPE growth method is advantageous in that growth of a thick film having a thickness of several to several hundred micrometers ($\mu$m) is possible. In particular, according to the HVPE growth method, bulk growth up to several millimeters (mm) is also possible depending on growth conditions and the conditions of use of a substrate.

However, internal stress is generated in a gallium nitride (GaN) layer due to difference in lattice constants between a heterogeneous substrate and a gallium nitride (GaN) semiconductor, and more stress is accumulated at the interface during cooling after growth. As a result, cracks occur when growth exceeds a certain thickness, and dislocation occurs at the interface between sapphire and gallium nitride to relax the stress.

The generated dislocation is transmitted in the crystal growth direction, and threading dislocation is transmitted to the growth surface, thus decreasing the crystallinity of the nitride semiconductor substrate and ultimately lowering the electrical characteristics of the device.

To solve these problems, in Korean Patent No. 10-0893360, a method of controlling the ratio of $HCl:NH_3$ when a buffer layer for a gallium nitride single crystal is formed using a HVPE growth method has been proposed. In a conventional method of forming a buffer layer, a technique of forming a nano-porous buffer layer at the interface between a sapphire substrate and gallium nitride to reduce a coefficient of expansion between the gallium nitride and the sapphire substrate is disclosed.

However, in the conventional method, since a sapphire substrate is pretreated with HCl before growth, the process is complicated, and the sapphire substrate is damaged (e.g., etched) due to HCl, thereby increasing crystal defects. Further, since ammonia ($NH_3$) is injected at a relatively high flow rate in the final stage of the process, gallium nitride does not grow uniformly on the surface of the sapphire substrate, and poly gallium nitride (poly GaN) grows intensively at the edges of the sapphire substrate.

In addition, in Japanese Patent Application Publication No. 2009-519202, a technique of controlling the flow rate of $NH_3$ and HCl, in particular, a technique of controlling the flow rate of $NH_3$, to reduce bowing of a group III nitride when the group III nitride is allowed to grow using a HVPE growth method has been proposed.

However, in the case of the conventional method, gallium nitride does not grow uniformly on the surface of a sapphire substrate, and poly gallium nitride (poly GaN) grows intensively at the edges of the sapphire substrate. In addition, it is difficult to obtain a low-defect material having high optical quality by allowing gallium nitride to grow to a desired thickness within an allowable range while preventing occurrence of defects in the crystal structure of the grown group III nitride.

In addition, in Japanese Patent Application Publication No. 2004-296640, a technique of controlling a V/III ratio to fabricate a high-quality gallium nitride semiconductor layer when the gallium nitride semiconductor layer is allowed to grow by the HVPE growth method has been proposed.

However, in the case of the conventional method, it is difficult to obtain a low-defect material having high optical quality by allowing gallium nitride to grow to a desired thickness within an allowable range while preventing occurrence of defects in the crystal structure of the grown gallium nitride semiconductor layer.

In addition, in a conventional HVPE growth method conducted by Hae-Yong Lee, a technique of reducing bowing of gallium nitride by rotating a susceptor at 100 rpm and a growth temperature of 1,010° C. when gallium nitride is allowed to grow has been proposed.

However, in the case of the conventional method, the degree of process difficulty increases, and a bowing phenomenon of grown gallium nitride is not completely solved.

In addition, in a conventional HVPE growth technique conducted by P. Visconti, a technique of reducing defects that may occur in gallium nitride grown through chemical etching using potassium hydroxide (KOH) and phosphoric acid ($H_3PO_4$) has been proposed.

However, in the case of the conventional method, since a growth process is performed and then a chemical etching process is performed, an additional process step is required, and gallium nitride may be damaged by excessive chemical etching.

RELATED DOCUMENTS

Patent Documents

Korean Patent No. 10-0893360, "Method of forming buffer layer for growth of gallium nitride single crystal"
Japanese Patent Application Publication No. 2009-519202, "Group III nitride product and method of manufacturing the same"
Japanese Patent Application Publication No. 2004-296640, "Method for growth of GaN semiconductor layer and method of fabricating semiconductor substrate and semiconductor device using GaN semiconductor layer"

Non-Patent Documents

Hae-Yong Lee et al., 7, 2014, "Control of mechanical bow for GaN substrate grown by HVPE with relatively longer radius of lattice curvature"

P. Visconti et al., 4, 2000, "Dislocation density in GaN determined by photoelectrochemical and hot-wet etching"

SUMMARY OF THE DISCLOSURE

Therefore, the present disclosure has been made in view of the above problems, and it is an object of the present disclosure to provide a method of fabricating a gallium nitride substrate free from bowing and cracking, wherein, when the gallium nitride substrate is fabricated, gallium nitride grows evenly on the surface of a sapphire substrate by allowing gallium nitride (GaN) to grow while lowering the flow rate ratio of ammonia gas to hydrogen chloride gas stepwise, thereby preventing poly gallium nitride (poly GaN) from intensively growing at the edges of the sapphire substrate.

It is another object of the present disclosure to provide a method of fabricating a gallium nitride substrate having a pit gallium nitride layer similar to a mirror gallium nitride layer thereon, wherein, when the gallium nitride substrate is fabricated, the first and second surface treatments are performed to reduce the surface roughness of a sapphire substrate, thereby allowing a pit gallium nitride layer similar to a mirror gallium nitride layer to grow.

It is yet another object of the present disclosure to provide a method of fabricating a gallium nitride substrate with a reduced occurrence of crystal defects, wherein, when the gallium nitride substrate is fabricated, a large lattice mismatch between a sapphire substrate and gallium nitride is reduced by forming a buffer layer.

In accordance with the present disclosure, the above and other objects can be accomplished by the provision of a method of fabricating a gallium nitride substrate, including a step of injecting ammonia gas ($NH_3$) to perform first surface treatment on a sapphire substrate; a step of injecting ammonia gas and hydrogen chloride (HCl) gas to form a buffer layer on the sapphire substrate; a step of injecting ammonia gas to perform second surface treatment on the sapphire substrate; and a step of allowing gallium nitride to grow on the sapphire substrate while lowering the flow rate ratio of ammonia gas to hydrogen chloride gas ($NH_3$:HCl) stepwise.

In the step of allowing gallium nitride to grow on the sapphire substrate while lowering the flow rate ratio of ammonia gas to hydrogen chloride gas stepwise, the flow rate of ammonia gas may be lowered stepwise over time and the flow rate of hydrogen chloride gas may be kept constant over time.

In the step of allowing gallium nitride to grow on the sapphire substrate while lowering the flow rate ratio of ammonia gas to hydrogen chloride gas stepwise, bowing of the gallium nitride substrate may be controlled by the flow rate ratio of ammonia gas to hydrogen chloride gas.

The flow rate ratio of ammonia gas to hydrogen chloride gas may be 2 to 10.8. The gallium nitride may include a pit gallium nitride (pit GaN) layer and a mirror gallium nitride (mirror GaN) layer.

The pit gallium nitride layer may have a thickness of 50 µm to 200 µm.

The mirror gallium nitride layer may have a thickness of 50 µm to 200 µm.

The buffer layer may be aluminum nitride (AlN).

BRIEF DESCRIPTION OF THE DRAWINGS

The above and other objects, features and other advantages of the present disclosure will be more clearly understood from the following detailed description taken in conjunction with the accompanying drawings, in which:

FIGS. 1a to 1c include a flowchart and graphs for explaining a method of fabricating a gallium nitride substrate according to an embodiment of the present disclosure;

FIG. 2 is a graph showing the thickness of each of the gallium nitride substrates fabricated according to Example 1 of the present disclosure and the thickness of each of the gallium nitride substrates fabricated according to Comparative Examples 1 to 6;

FIG. 3 is a graph showing bowing of gallium nitride substrates before laser lift-off, when the gallium nitride substrates are fabricated according to Example 1 or Comparative Examples 1 to 6 of the present disclosure;

FIG. 4 is a graph showing bowing of gallium nitride substrates after sapphire substrates are separated through a laser lift-off process, when the gallium nitride substrates are fabricated according to Example 1 or Comparative Examples 1 to 6 of the present disclosure; and FIGS. 5a to 5c are scanning electron microscope-cathodoluminescence (SEM-CL) images of the mirror gallium nitride layer (170 µm) of the gallium nitride substrate fabricated according to Example 1 of the present disclosure.

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a method of fabricating a gallium nitride substrate according to an embodiment of the present disclosure will be described with reference to FIGS. 1a to 1c.

FIGS. 1a to 1c include a flowchart and graphs for explaining a method of fabricating a gallium nitride substrate according to an embodiment of the present disclosure.

The method of fabricating a gallium nitride substrate according to an embodiment of the present disclosure may be performed using hydride vapor phase epitaxy.

A hydride vapor phase epitaxy device may include a reactor, a substrate support disposed in the reactor and supporting a sapphire substrate, an introduction chamber arranged to be connected to the reactor, and a heater. Carrier gas, ammonia ($NH_3$) gas, and hydrogen chloride (HCl) gas may be supplied to the introduction chamber.

In addition, in the introduction chamber, a container containing gallium (Ga) is disposed, and hydrogen chloride gas supplied to the introduction chamber reacts with gallium contained in the container to generate gallium chloride (GaCl) gas. The generated gallium chloride gas may be supplied to the reactor together with carrier gas and ammonia gas to allow gallium nitride to grow.

In addition, since the flow rate of hydrogen chloride gas is proportional to the partial pressure of gallium chloride gas, the flow rate ratio of ammonia gas to gallium chloride gas ($NH_3$:GaCl) (x:1) may be equal to the flow rate ratio of ammonia gas to hydrogen chloride gas ($NH_3$:HCl) (x:1).

As the carrier gas, an inert gas may be used. Preferably, hydrogen ($H_2$) gas or nitrogen ($N_2$) gas is used as the carrier gas.

The method of fabricating a gallium nitride substrate according to an embodiment of the present disclosure includes a step S110 of injecting ammonia gas to perform first surface treatment on a sapphire substrate, a step S120 of injecting ammonia gas and hydrogen chloride gas to form a buffer layer on the sapphire substrate, and a step S130 of injecting ammonia gas to perform second surface treatment on the sapphire substrate.

Thereafter, a step S140 of allowing gallium nitride to grow on the sapphire substrate while lowering the flow rate ratio (x:1) of ammonia gas to hydrogen chloride gas stepwise is performed.

Therefore, when the method of fabricating a gallium nitride substrate according to an embodiment of the present disclosure is used. Gallium nitride may evenly grow on the surface of a sapphire substrate by allowing gallium nitride to grow while lowering the flow rate ratio (x:1) of ammonia gas to hydrogen chloride gas stepwise, thereby preventing poly gallium nitride (poly GaN) from intensively growing at the edges of the sapphire substrate and minimizing a bowing phenomenon and a cracking phenomenon.

In addition, in the method of fabricating a gallium nitride substrate according to an embodiment of the present disclosure, step S110 of injecting ammonia gas to perform first surface treatment on a sapphire substrate, step S120 of injecting ammonia gas and hydrogen chloride gas to form a buffer layer on the sapphire substrate, and step S130 of injecting ammonia gas to perform second surface treatment on the sapphire substrate are separately described. However, formation of a buffer layer described in step S120 may be also performed in the steps S110 and S130.

Hereinafter, the method of fabricating a gallium nitride substrate according to an embodiment of the present disclosure will be described in detail with reference to FIGS. 1a to 1c.

In step S110, ammonia gas is injected to perform the first surface treatment on a sapphire substrate.

In the method of fabricating a gallium nitride substrate according to an embodiment of the present disclosure, the sapphire substrate may be mounted in a reactor, and then ammonia gas may be injected into the reactor to perform the first surface treatment on the sapphire substrate.

When ammonia gas is introduced to the sapphire substrate, a very thin aluminum nitride (AlN) film may be formed on the surface of the sapphire substrate, and the aluminum nitride film may act as the buffer layer.

For example, when the sapphire substrate is mounted in the reactor and then the surface of the sapphire substrate is etched at a temperature of 900° C. to 1,100° C. for 10 minutes to 1 hour using ammonia gas, aluminium oxide ($Al_2O_3$), which is a material of the sapphire substrate, reacts with ammonia gas, so that aluminum nitride may be formed on the surface of the sapphire substrate.

Reaction between aluminium oxide ($Al_2O_3$) and ammonia gas is represented by Formula 1 below.

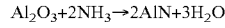

$$Al_2O_3 + 2NH_3 \rightarrow 2AlN + 3H_2O \qquad \text{[Formula 1]}$$

Referring to FIGS. 1b and 1c, in step S110, since hydrogen chloride gas is not injected but only ammonia gas is injected, the flow rate ratio (x:1) of ammonia gas to hydrogen chloride gas is zero.

In addition, in the step 110, ammonia gas may be injected at a flow rate of 16,000 sccm to 18,000 sccm. When ammonia gas is injected at a flow rate of 16,000 sccm or less, the amount and size of aluminum nitride generated may be reduced. When ammonia gas is injected at a flow rate greater than 18,000 sccm, the amount and size of aluminum nitride generated may be excessively increased.

In step S120, ammonia gas and hydrogen chloride (HCl) gas are injected to form a buffer layer on a sapphire substrate.

According to the method of fabricating a gallium nitride substrate according to an embodiment of the present disclosure, ammonia gas and hydrogen chloride gas may be injected into a reactor equipped with the sapphire substrate to form the buffer layer on the sapphire substrate.

For example, when the sapphire substrate is mounted in the reactor and then the surface of the sapphire substrate is etched at a temperature of 900° C. to 1,100° C. for 10 minutes to 1 hour using ammonia gas and hydrogen chloride gas, aluminium oxide ($Al_2O_3$), which is a material of the sapphire substrate, reacts with ammonia gas and hydrogen chloride gas, so that aluminum nitride acting as the buffer layer may be formed on the surface of the sapphire substrate.

In addition, compared with step S110, in step S120, hydrogen chloride gas is additionally injected, and thus a buffer layer may be intensively formed. Therefore, aluminum nitride formed in step S120 may be thicker than that formed in step S110.

Referring to FIGS. 1b and 1c, in step S120, ammonia gas is injected at the same flow rate as in step S110, but hydrogen chloride gas is injected at a constant flow rate differently from step S110.

In addition, in the step 110, ammonia gas may be injected at a flow rate of 16,000 sccm to 18,000 sccm. When ammonia gas is injected at a flow rate of 16,000 sccm or less, the amount and size of aluminum nitride generated may be reduced. When ammonia gas is injected at a flow rate greater than 18,000 sccm, the amount and size of aluminum nitride generated may be excessively increased.

In addition, in step S120, hydrogen chloride gas may be injected at a flow rate of 1,000 sccm to 2,000 sccm. When hydrogen chloride gas is injected at a flow rate of 1,000 sccm or less, aluminum nitride may not grow sufficiently. When hydrogen chloride gas is injected at a flow rate greater than 2,000 sccm, growth and etching of aluminum nitride may proceed at the same time, which may cause problems in formation of aluminum nitride.

In addition, in step S120, the flow rate ratio (x:1) of ammonia gas to hydrogen chloride gas may be 11 to 13. When the flow rate ratio is 12 or less, the amount and size of aluminum nitride generated may be reduced. When the flow rate ratio is greater than 13, the amount and size of aluminum nitride generated may be excessively increased.

According to the method of fabricating a gallium nitride substrate according to an embodiment of the present disclosure, the buffer layer may be formed in situ without any additional process, so that the degree of process difficulty may be reduced.

In addition, the buffer layer may serve to minimize the density of crystal defects by reducing crystallographic difference between the sapphire substrate and the gallium nitride to grow in a subsequent process.

In step S130, ammonia gas is injected to perform second surface treatment on the sapphire substrate.

According to the method of fabricating a gallium nitride substrate according to an embodiment of the present disclosure, ammonia gas may be injected into a reactor equipped with the sapphire substrate to perform the second surface treatment on the sapphire substrate.

In addition, the second surface treatment may be performed in the same manner as the first surface treatment.

When ammonia gas is introduced to the sapphire substrate, a very thin aluminum nitride (AlN) film may be formed on the surface of the sapphire substrate, and the aluminum nitride film may act as the buffer layer.

For example, when the sapphire substrate is mounted in the reactor and then the surface of the sapphire substrate is etched at a temperature of 900° C. to 1,100° C. for 10 minutes to 1 hour using ammonia gas, aluminium oxide ($Al_2O_3$), which is a material of the sapphire substrate, reacts with ammonia gas, so that aluminum nitride may be formed on the surface of the sapphire substrate.

Referring to FIGS. 1b and 1c, in step S110, since hydrogen chloride gas is not injected but only ammonia gas is injected, the flow rate ratio (x:1) of ammonia gas to hydrogen chloride gas is zero.

In addition, in the step 110, ammonia gas may be injected at a flow rate of 16,000 sccm to 18,000 sccm. When ammonia gas is injected at a flow rate of 16,000 sccm or less, the amount and size of aluminum nitride generated may be reduced. When ammonia gas is injected at a flow rate greater than 18,000 sccm, the amount and size of aluminum nitride generated may be excessively increased.

According to the method of fabricating a gallium nitride substrate according to an embodiment of the present disclosure, by forming the buffer layer through the steps S110, S120, and S130, the surface roughness of gallium nitride may be reduced, so that gallium nitride having a surface similar to the surface of a mirror may grow.

In step S140, gallium nitride is allowed to grow on the sapphire substrate while lowering the flow rate ratio (x:1) of ammonia gas to hydrogen chloride gas stepwise.

According to the method of fabricating a gallium nitride substrate according to an embodiment of the present disclosure, gallium nitride may be allowed to grow while the flow rate ratio (x:1) of ammonia gas to hydrogen chloride gas in a reactor equipped with the sapphire substrate is lowered stepwise.

In addition, step S140 may include a step S141 of allowing a pit gallium nitride (pit GaN) layer to grow and a step S142 of allowing a mirror gallium nitride (mirror GaN) layer to grow.

The pit gallium nitride layer is an initially grown gallium nitride layer having a larger number of defects than the mirror gallium nitride layer, and the mirror gallium nitride layer is a gallium nitride layer formed on the pit gallium nitride layer and having a surface similar to the surface of a mirror. In step S140, the pit gallium nitride layer and the mirror gallium nitride layer are separately described, but the pit gallium nitride layer and the mirror gallium nitride layer may be formed naturally during the growth process.

Referring to FIG. 1b, in step S140, the flow rate of ammonia gas is decreased stepwise over time, whereas the flow rate of hydrogen chloride gas is kept constant over time.

In addition, according to an embodiment, in step S140, the flow rate of hydrogen chloride may be kept constant over time during step S141 of allowing a pit gallium nitride layer to grow, and the flow rate of hydrogen chloride in step S142 of allowing a mirror gallium nitride layer to grow may be kept constant at a value lower than the flow rate of hydrogen chloride in step S141.

In step S142 of allowing a mirror gallium nitride layer to grow, the growth rate of the mirror gallium nitride layer is proportional to the flow rate of hydrogen chloride (or the flow rate of gallium chloride). Thus, when hydrogen chloride is injected at the same flow rate as during growth of the pit gallium nitride layer, a porous mirror gallium nitride layer may be formed due to rapid growth rate. As a result, a mirror gallium nitride layer having high threading dislocation density may be formed.

Therefore, the growth rate of the mirror gallium nitride layer may be lowered to reduce the threading dislocation density of the mirror gallium nitride layer, and the flow rate of hydrogen chloride (or the flow rate of gallium chloride) may be lowered to lower the growth rate.

In addition, referring to FIG. 1c, during step S140, the flow rate ratio (x:1) of ammonia gas to hydrogen chloride gas is lowered stepwise.

Preferably, in step S141 of allowing a pit gallium nitride layer to grow, the flow rate ratio (x:1) of ammonia gas to hydrogen chloride gas is lowered stepwise until the pit gallium nitride layer is formed. In step S142 of allowing a mirror gallium nitride layer to grow, the flow rate ratio (x:1) of ammonia gas to hydrogen chloride gas is maintained at a constant value.

Therefore, according to the method of fabricating a gallium nitride substrate according to an embodiment of the present disclosure, gallium nitride may be allowed to evenly grow on the surface of a sapphire substrate by lowering the flow rate ratio (x:1) of ammonia gas to hydrogen chloride gas stepwise during growth of gallium nitride. In addition, it is possible to prevent poly gallium nitride from intensively growing at the edges of the sapphire substrate, thereby minimizing occurrence of bowing and cracking.

In addition, when gallium nitride is allowed to grow, the flow rate ratio (x:1) of ammonia gas to hydrogen chloride gas may be lowered stepwise, thereby minimizing stress generated during growth of gallium nitride.

In step S140, ammonia gas may be injected at a flow rate of 3,000 sccm to 20,000 sccm. When ammonia gas is injected at a flow rate of 3,000 sccm or less, the growth rate of gallium nitride may be very low. When ammonia gas is injected at a flow rate greater than 20,000 sccm, porous gallium nitride may grow very quickly.

In addition, in step S140, hydrogen chloride gas may be injected at a flow rate of 1,000 sccm to 3,000 sccm. When hydrogen chloride gas is injected at a flow rate of 1,000 sccm or less, the growth rate of gallium nitride is remarkably lowered. When hydrogen chloride gas is injected at a flow rate greater than 3,000 sccm, the growth rate of gallium nitride may be increased, but the surface roughness of gallium nitride may be increased.

In addition, in step S140, the flow rate ratio (x:1) of ammonia gas to hydrogen chloride gas may be 2 to 10.8. When the flow rate ratio is 2 or less, the growth rate of gallium nitride may be lowered. When the flow rate ratio is greater than 10.8, the growth rate of gallium nitride may be increased, but porous gallium nitride may grow.

Preferably, in step S141, ammonia gas may be injected at a flow rate of 4,000 sccm to 20,000 sccm. When ammonia gas is injected at a flow rate of 4,000 sccm or less, porous gallium nitride may not grow and stress generated between the sapphire substrate and the gallium nitride may not be reduced. When ammonia gas is injected at a flow rate greater than 20,000 sccm, porous gallium nitride may grow, but the surface roughness of the grown gallium nitride may be increased, which may interfere with growth of gallium nitride.

Therefore, in step S141, the flow rate ratio (x:1) of ammonia gas to hydrogen chloride gas may be 2 to 10.8. When the flow rate ratio is 2 or less, porous gallium nitride may not grow, which may cause cracking of gallium nitride. When the flow rate ratio is greater than 10.8, the surface roughness of the grown gallium nitride may be increased, which may interfere with growth of gallium nitride.

Preferably, in step S142, ammonia gas may be injected at a flow rate of 2,000 sccm to 4,000 sccm. When ammonia gas is injected at a flow rate of 2,000 sccm or less, gallium nitride may not grow sufficiently. When ammonia gas is injected at a flow rate greater than 4,000 sccm, porous gallium nitride may grow.

In addition, in step S142, the flow rate ratio (x:1) of ammonia gas to hydrogen chloride gas may be 1 to 3. When the flow rate ratio is 1 or less, the growth rate of gallium nitride may be lowered. When the flow rate ratio is greater than 3, porous gallium nitride may grow.

In addition, according to the method of fabricating a gallium nitride substrate according to an embodiment of the present disclosure, bowing of the gallium nitride substrate may be controlled by the flow rate ratio of ammonia gas to hydrogen chloride gas.

Therefore, bowing of the gallium nitride substrate may be controlled by adjusting the ratio of ammonia gas to hydrogen chloride gas based on the initial bowing degree of the substrate. In addition, according to an embodiment, a curved gallium nitride substrate may be fabricated, and this type of substrate may be used in various fields.

In addition, according to the method of fabricating a gallium nitride substrate according to an embodiment of the present disclosure, the ratio of ammonia gas to hydrogen chloride gas may be adjusted (stepwise decreased) over time, and the ratio of ammonia gas to hydrogen chloride gas may also be adjusted (stepwise decreased) according to the thickness of a growing gallium nitride layer, so that bowing of the gallium nitride substrate may be adjusted.

The pit gallium nitride layer may have a thickness of 50 μm to 200 μm. When the thickness of the pit gallium nitride layer is 50 μm or less, stress generated between the sapphire substrate and the grown gallium nitride may not be reduced. When the thickness of the pit gallium nitride layer is greater than 200 μm, a mirror gallium nitride may not be formed thick.

The mirror gallium nitride layer may have a thickness of 50 μm to 200 μm. When the thickness of the mirror gallium nitride layer is 50 μm or less, the threading dislocation of the grown gallium nitride may not be reduced, thereby increasing defect density. When the thickness of the mirror gallium nitride layer is greater than 200 μm, cracks may occur during a ramp down process of lowering the temperature of the layer to room temperature after growth.

According to the method of fabricating a gallium nitride substrate according to an embodiment of the present disclosure, a gallium nitride substrate having a self-standing structure may be fabricated by separating gallium nitride from a sapphire substrate.

According to the method of fabricating a gallium nitride substrate according to an embodiment of the present disclosure, the grown gallium nitride may be separated from the sapphire substrate using at least one of etching, laser lift-off (LLO), and a mechanical method. Preferably, laser lift-off is used. More preferably, laser lift-off using ultraviolet light of 355 nm is used.

For example, gallium nitride and the sapphire substrate may be separated by irradiating the sapphire substrate with a high-power ultraviolet laser. In this case, since the ultraviolet laser used has lower energy than the band gap of the sapphire substrate and has higher energy than the band gap of gallium nitride, the irradiated ultraviolet laser passes through the sapphire substrate, and laser energy is applied at the interface of gallium nitride.

Therefore, the sapphire substrate and the gallium nitride interface are momentarily melted, so that the sapphire substrate and the gallium nitride are separated from each other. In this case, when the process of separating the sapphire substrate is performed, residual materials may remain at the interface between the sapphire substrate and gallium nitride. However, the residual materials may be removed, for example, by etching.

In addition, according to the method of fabricating a gallium nitride substrate according to an embodiment of the present disclosure, a gallium nitride substrate having a template substrate structure may be fabricated by terminating the process without removing the sapphire substrate after growth of gallium nitride is completed.

In the case of the gallium nitride substrate fabricated using the method of fabricating a gallium nitride substrate according to an embodiment of the present disclosure, a cracking phenomenon is reduced by a stress relaxation effect, and defect density is reduced by growth mode control. Therefore, even when a thick gallium nitride film having a thickness of 300 μm or more and a diameter of 50.8 mm (2 inch) or more is allowed to grow on a sapphire substrate, defects, bowing, and cracking do not occur. In terms of thickness, the thick gallium nitride film may grow indefinitely.

A preferred embodiment of the method of fabricating a gallium nitride substrate according to the present disclosure will be described in Example 1 below.

Example 1

After a sapphire substrate was inserted into a hydride vapor phase growth reactor, the first surface treatment was performed at a temperature of 950° C. while ammonia gas was supplied, an aluminum nitride buffer layer was formed while ammonia gas and hydrogen chloride gas were supplied, and the second surface treatment was performed while ammonia gas was supplied again.

Next, gallium was placed in a gallium container included in the hydride vapor phase growth reactor, and hydrogen chloride gas was supplied while maintaining temperature at 850° C. to generate gallium chloride gas. Through another injection port, ammonia gas was supplied to the container set to a temperature of 950° C. while reducing the flow rate of ammonia gas stepwise (i.e., lowering the flow rate ratio (x:1) of ammonia gas to hydrogen chloride gas stepwise), so that gallium nitride having a thickness of about 300 μm was allowed to grow on a single crystal substrate.

In addition, 10 gallium nitride substrates were fabricated through the same process to test the reliability of the process.

The process conditions of the method of fabricating a gallium nitride substrate according to Example 1 of the present disclosure are shown in Table 1.

Table 1 is a table showing the process conditions of the method of fabricating a gallium nitride substrate according to an embodiment of the present disclosure.

| Growth stage | | Ratio | Ammonia (sccm) | Gallium chloride (sccm) | Nitrogen (sccm) | Sum (NH$_3$ + N$_2$, sccm) | Growth Rate (μm/min) | Time |
|---|---|---|---|---|---|---|---|---|
| First surface treatment | 1 | — | 16,800 | 0 | 19,800 | 36,600 | — | 1 |
| Buffer layer (AlN) | 2 | 12.0 | 16,800 | 1,400 | 19,800 | 38,000 | 0.05 | 5 |
| Second surface treatment | 3 | — | 16,800 | 0 | 19,800 | 36,600 | — | 2 |
| Gallium nitride Pit gallium nitride layer | 1 | 10.8 | 19,600 | 1,800 | 8,400 | 28,000 | 1.33 | 7.5 |
| | 2 | 10.3 | 18,500 | 1,800 | 9,500 | 28,000 | 1.32 | 7.58 |
| | 3 | 9.7 | 17,400 | 1,800 | 10,600 | 28,000 | 1.30 | 7.66 |
| | 4 | 9.1 | 16,300 | 1,800 | 11,700 | 28,000 | 1.29 | 7.75 |
| | 5 | 8.5 | 15,300 | 1,800 | 12,700 | 28,000 | 1.28 | 7.83 |
| | 6 | 7.9 | 14,200 | 1,800 | 13,800 | 28,000 | 1.26 | 7.92 |
| | 7 | 7.3 | 13,100 | 1,800 | 14,900 | 28,000 | 1.25 | 8.01 |
| | 8 | 6.7 | 12,000 | 1,800 | 16,000 | 28,000 | 1.23 | 8.11 |
| | 9 | 6.1 | 11,000 | 1,800 | 17,000 | 28,000 | 1.22 | 8.2 |
| | 10 | 5.5 | 9,900 | 1,800 | 18,100 | 28,000 | 1.20 | 8.3 |
| | 11 | 4.9 | 8,800 | 1,800 | 19,200 | 28,000 | 1.19 | 8.4 |
| | 12 | 4.3 | 7,700 | 1,800 | 20,300 | 28,000 | 1.18 | 8.5 |
| | 13 | 3.7 | 6,600 | 1,800 | 21,400 | 28,000 | 1.16 | 8.6 |
| | 14 | 3.1 | 5,500 | 1,800 | 22,500 | 28,000 | 1.15 | 8.71 |
| | 15 | 2.5 | 4,400 | 1,800 | 23,600 | 28,000 | 1.13 | 8.82 |
| Minor gallium nitride layer | 1 | 2 | 2,000 | 1,000 | 26,000 | 28,000 | 0.64 | 236 |

In the method of fabricating a gallium nitride substrate using hydride vapor phase epitaxy according to Example 1 of the present disclosure, only ammonia gas is injected at a flow rate of 16,800 sccm during the first surface treatment and the second surface treatment.

In addition, after the first surface treatment, ammonia gas was injected at a flow rate of 16,800 sccm and gallium chloride was injected at a flow rate of 1,400 sccm (equal to the flow rate of hydrogen chloride) to form a buffer layer.

In addition, according to the method of fabricating a gallium nitride substrate using hydride vapor phase epitaxy according to Example 1 of the present disclosure, the flow rate ratio of ammonia gas to gallium chloride gas (or ammonia gas to hydrogen chloride gas) was gradually lowered over 16 steps, so that gallium nitride was allowed to grow on the sapphire substrate. At this time, a growth process of a pit gallium nitride layer was performed in 15 steps, and a growth process of a mirror gallium nitride layer was performed in 1 step.

As shown in Table 1, the flow rate of ammonia gas is decreased stepwise during growth of gallium nitride. In each step (step 1 to step 16), ammonia gas is injected at the same flow rate for a certain period of time or for a period of time when a layer of a certain thickness is formed.

On the other hand, gallium chloride gas (or hydrogen chloride gas) is injected at a constant flow rate during growth of gallium nitride. Therefore, the flow rate ratio of ammonia gas to hydrogen chloride gas is gradually lowered stepwise.

Comparative Example 1

Gallium was placed in a gallium container included in a hydride vapor phase growth reactor, and hydrogen chloride gas was supplied at a flow rate of 1,800 sccm while maintaining temperature at 850° C. to generate gallium chloride gas having a flow rate of 1,800 sccm. Through another injection port, ammonia gas was supplied at a flow rate of 19,600 sccm to the container set to a temperature of 990° C. (at this time, the flow rate ratio of ammonia gas to hydrogen chloride gas was set to 10.8:1), so that a pit gallium nitride layer having a thickness of about 100 μm and a mirror gallium nitride layer having a thickness of about 200 μm (i.e., gallium nitride having a thickness of about 300 μm) were allowed to grow on a single crystal substrate.

In addition, 10 gallium nitride substrates were fabricated through the same process to test the reliability of the process.

Comparative Example 2

A gallium nitride substrate was fabricated in the same manner as in Comparative Example 1, except that a pit gallium nitride layer having a thickness of 75 μm and a mirror gallium nitride layer having a thickness of 225 μm were allowed to grow so that gallium nitride having a thickness of 300 μm was formed.

Comparative Example 3

A gallium nitride substrate was fabricated in the same manner as in Comparative Example 1, except that a mirror gallium nitride layer having a thickness of 180 μm was allowed to grow.

Comparative Example 4

A gallium nitride substrate was fabricated in the same manner as in Comparative Example 1, except that a mirror gallium nitride layer having a thickness of 220 μm was allowed to grow.

Comparative Example 5

A gallium nitride substrate was fabricated in the same manner as in Comparative Example 1, except that a mirror gallium nitride layer having a thickness of 175 μm was allowed to grow.

Comparative Example 6

A gallium nitride substrate was fabricated in the same manner as in Comparative Example 1, except that a mirror gallium nitride layer having a thickness of 205 μm was allowed to grow.

Hereinafter, the characteristics of a gallium nitride substrate fabricated according to a method of fabricating a gallium nitride substrate according to an embodiment of the present disclosure will be described with reference to FIGS. 2 to 5c.

FIG. 2 is a graph showing the thickness of each of the gallium nitride substrates fabricated according to Example 1 of the present disclosure and the thickness of each of the gallium nitride substrates fabricated according to Comparative Examples 1 to 6.

In Table 2, the thickness of the gallium nitride substrates fabricated according to Example 1 of the present disclosure and the thickness of the gallium nitride substrates fabricated according to Comparative Examples 1 to 6 are shown.

| | Thickness (μm) | | | | | | | | | | |
|---|---|---|---|---|---|---|---|---|---|---|---|
| | 1 | 2 | 3 | 4 | 5 | 6 | 7 | 8 | 9 | 10 | Average |
| Comparative Example 1 | 320.7 | 305.1 | 300.5 | 292.0 | 293.8 | 291.8 | 291.1 | 293.9 | 298.1 | 288.0 | 297.5 |
| Comparative Example 2 | 326.8 | 312.3 | 300.8 | 304.6 | 305.8 | 303.0 | 297.0 | 273.5 | 276.2 | 273.2 | 297.3 |
| Comparative Example 3 | 298.5 | 292.8 | 281.1 | 276.4 | 278.3 | 278.9 | 275.2 | 275.1 | 258.5 | 281.4 | 279.6 |
| Comparative Example 4 | 336.9 | 326.2 | 316.1 | 312.6 | 311.0 | — | — | — | — | — | 320.6 |
| Comparative Example 5 | 299.1 | 287.4 | 285.7 | 275.3 | 275.7 | 272.3 | 270.2 | 269.3 | 274.1 | 244.6 | 275.4 |
| Comparative Example 6 | 328.2 | 320.0 | 308.3 | 308.3 | 302.5 | 303.8 | 304.1 | 302.9 | 302.8 | 276.7 | 305.8 |
| Example 1 | 340.6 | 335.8 | 315.5 | 318.2 | 309.3 | 313.4 | 309.4 | 318.3 | 318.1 | 297.8 | 317.7 |

Referring to FIG. 2 and Table 2, the gallium nitride substrates fabricated according to Example 1 of the present disclosure have uniform thickness, as compared with the gallium nitride substrates fabricated according to Comparative Examples 1 to 6.

FIG. 3 is a graph showing bowing of gallium nitride substrates before laser lift-off, when the gallium nitride substrates are fabricated according to Example 1 or Comparative Examples 1 to 6 of the present disclosure.

Table 3 shows bowing of gallium nitride substrates before laser lift-off when the gallium nitride substrates are fabricated according to Example 1 or Comparative Examples 1 to 6 of the present disclosure.

TABLE 3

| | | Bowing (μm) | | | | | | | | | | |
|---|---|---|---|---|---|---|---|---|---|---|---|---|
| | | 1 | 2 | 3 | 4 | 5 | 6 | 7 | 8 | 9 | 10 | Average |
| Growth | Comparative Example 1 | 769 | 819 | 817 | 833 | 829 | 832 | 849 | 850 | 836 | 827 | 826.1 |
| | Comparative Example 2 | 785 | 808 | 805 | 796 | 805 | 824 | 817 | 840 | 835 | 817 | 813.2 |
| | Comparative Example 3 | 778 | 791 | 816 | 798 | 781 | 790 | 804 | 801 | 794 | 817 | 797.0 |
| | Comparative Example 4 | 795 | 832 | 853 | 847 | 836 | — | — | — | — | — | 832.6 |
| | Comparative Example 5 | 768 | 802 | 821 | 796 | 802 | 687 | 799 | 769 | 811 | 794 | 784.9 |
| | Comparative Example 6 | 778 | 793 | 806 | 809 | 806 | 813 | 817 | 815 | 827 | 824 | 809.0 |
| | Example 1 | 851 | 857 | 833 | 844 | 820 | 840 | 824 | 863 | 861 | 825 | 842 |

Referring to FIG. 3 and Table 3, the gallium nitride substrates fabricated using the method of fabricating a gallium nitride substrate according to Example 1 of the present disclosure have a degree of bowing similar to that of the gallium nitride substrates fabricated using the method of fabricating a gallium nitride substrate using hydride vapor phase epitaxy according to Comparative Examples 1 to 6.

FIG. 4 is a graph showing bowing of gallium nitride substrates after sapphire substrates are separated through a laser lift-off process, when the gallium nitride substrates are fabricated according to Example 1 or Comparative Examples 1 to 6 of the present disclosure.

Table 4 shows bowing of gallium nitride substrates after sapphire substrates are separated through a laser lift-off process, when the gallium nitride substrates are fabricated according to Example 1 or Comparative Examples 1 to 6 of the present disclosure.

TABLE 4

| | | Bowing (μm) | | | | | | | | | | |
|---|---|---|---|---|---|---|---|---|---|---|---|---|
| | | 1 | 2 | 3 | 4 | 5 | 6 | 7 | 8 | 9 | 10 | Average |
| Laser lift-off | Comparative Example 1 | −136 | −30 | −42 | −16 | −3 | −11 | −2 | −160 | −106 | −136 | −64.2 |
| | Comparative Example 2 | −282 | −196 | −49 | −35 | −50 | −72 | −82 | −185 | −130 | −207 | −128.8 |
| | Comparative Example 3 | −184 | −224 | −70 | −103 | −22 | −29 | −75 | −42 | −116 | −144 | −100.9 |
| | Comparative Example 4 | −322 | −180 | −150 | −162 | −140 | — | — | — | — | — | −190.8 |
| | Comparative Example 6 | −213 | −315 | −105 | −185 | −97 | −130 | −163 | −144 | −195 | −315 | −186 |
| | Example 1 | −62 | −30 | −13 | −17 | −57 | −42 | −82 | −10 | −50 | −47 | −50 |

Referring to FIG. 4 and Table 4, the gallium nitride substrates fabricated according to Example 1 of the present disclosure have a smaller bowing value than the gallium nitride substrates fabricated using the method of fabricating a gallium nitride substrate according to Comparative Examples 1 to 6.

Preferably, a gallium nitride substrate has an average bowing value of −30 μm.

The gallium nitride substrates fabricated according to Example 1 of the present disclosure have an average bowing value of −50 μm.

Therefore, when the method of fabricating a gallium nitride substrate according to Example 1 of the present disclosure is used, gallium nitride is allowed to evenly grow on the surface of a sapphire substrate, which prevents poly gallium nitride from intensively growing at the edges of a sapphire substrate, thereby minimizing bowing and minimizing stress generated during growth of gallium nitride. As a result, a gallium nitride substrate free from cracking may be fabricated.

FIGS. 5a to 5c are scanning electron microscope-cathodoluminescence (SEM-CL) images of the mirror gallium nitride layer (170 μm) of the gallium nitride substrate fabricated according to Example 1 of the present disclosure.

Referring to FIGS. 5a to 5c, the mirror gallium nitride layers of the gallium nitride substrates fabricated according to Example 1 of the present disclosure have a very low defect rate and are evenly formed.

In addition, the threading dislocation (TDD) of the central portion of the surface of the mirror gallium nitride layer shown in FIG. 5a was $1.31 \times 10^7$ cm$^{-2}$, the threading dislocation of the left edge of the surface of the mirror gallium nitride layer shown in FIG. 5b was $6.16 \times 10^6$ cm$^{-2}$, and the threading dislocation of the right edge of the surface of the mirror gallium nitride layer shown in FIG. 5c was $7.63 \times 10^6$ cm$^{-2}$.

Therefore, in the case of the gallium nitride substrates fabricated according to Example 1 of the present disclosure, threading dislocation is reduced.

According to an embodiment of the present disclosure, gallium nitride (GaN) evenly grows on the surface of a sapphire substrate by allowing gallium nitride to grow while lowering the flow rate ratio of ammonia gas to hydrogen chloride gas stepwise, thereby preventing poly gallium nitride (poly GaN) from intensively growing at the edges of the sapphire substrate. Therefore, a gallium nitride substrate free from bowing and cracking can be obtained.

According to an embodiment of the present disclosure, the first and second surface treatments are performed to reduce the surface roughness of a sapphire substrate, thereby allowing a pit gallium nitride layer similar to a mirror gallium nitride layer to grow.

According to an embodiment of the present disclosure, a large lattice mismatch between a sapphire substrate and gallium nitride is reduced by forming a buffer layer, thereby reducing occurrence of crystal defects.

Although the present disclosure has been described through limited examples and figures, the present disclosure is not intended to be limited to the examples. Those skilled in the art will appreciate that various modifications, additions, and substitutions are possible, without departing from the scope and spirit of the disclosure.

Therefore, it should be understood that there is no intent to limit the disclosure to the embodiments disclosed herein, rather, the disclosure is to cover all modifications, equivalents, and alternatives falling within the spirit and scope of the disclosure as defined by the claims.

What is claimed is:

1. A method of fabricating a gallium nitride substrate, comprising:
   injecting ammonia ($NH_3$) gas to perform first surface treatment on a sapphire substrate;
   injecting ammonia gas and hydrogen chloride (HCl) gas to form a buffer layer on the sapphire substrate;
   injecting ammonia gas to perform second surface treatment on the sapphire substrate; and
   allowing gallium nitride (GaN) to grow on the sapphire substrate while lowering a flow rate ratio (x:1) of ammonia gas to hydrogen chloride gas ($NH_3$:HCl) stepwise.

2. The method according to claim 1, wherein, in the allowing, the flow rate of ammonia gas is lowered stepwise over time and the flow rate of hydrogen chloride gas is kept constant over time.

3. The method according to claim 1, wherein, in the allowing, bowing of the gallium nitride substrate is controlled by the flow rate ratio of ammonia gas to hydrogen chloride gas.

4. The method according to claim 1, wherein the gallium nitride (GaN) comprises a pit gallium nitride (pit GaN) layer and a mirror gallium nitride (mirror GaN) layer.

5. The method according to claim 4, wherein the pit gallium nitride layer has a thickness of 50 μm to 200 μm.

6. The method according to claim 4, wherein the mirror gallium nitride layer has a thickness of 50 μm to 200 μm.

7. The method according to claim 1, wherein the buffer layer is aluminum nitride (AlN).

* * * * *